United States Patent [19]

Lasto et al.

[11] Patent Number: 5,419,481
[45] Date of Patent: May 30, 1995

[54] PROCESS AND APPARATUS FOR ATTACHING/DEATACHING LAND GRID ARRAY COMPONENTS

[75] Inventors: Clifford S. Lasto, Woodbridge; Jeffrey S. Duhaime, Ansonia, both of Conn.

[73] Assignee: Air-Vac Engineering Company, Inc., Milford, Conn.

[21] Appl. No.: 125,118

[22] Filed: Sep. 21, 1993

[51] Int. Cl.⁶ ............................................. B23K 1/012
[52] U.S. Cl. .................................. 228/6.2; 228/264; 228/191
[58] Field of Search ............... 228/6.2, 264, 191, 4.5, 228/221; 29/834

[56] References Cited

U.S. PATENT DOCUMENTS

| | | | |
|---|---|---|---|
| 4,552,300 | 11/1985 | Zovko et al. | 228/264 X |
| 4,564,135 | 1/1986 | Barresi et al. | 228/6.2 |
| 4,767,047 | 8/1988 | Todd et al. | 228/264 X |
| 4,787,548 | 11/1988 | Abbagnaro et al. | 228/264 X |
| 5,044,072 | 9/1991 | Blais et al. | 228/4.5 X |
| 5,152,447 | 10/1992 | Wallgren et al. | 228/6.2 X |

OTHER PUBLICATIONS

"Rework Fixture For Surface-Mounted Components", IBM Technical Disclosure Bulletin, vol. 29, No. 11, Apr. 1987, pp. 4718–4719.

*Primary Examiner*—P. Austin Bradley
*Assistant Examiner*—Jeanne M. Elpel
*Attorney, Agent, or Firm*—Perman & Green

[57] ABSTRACT

Process and nozzle device for the soldering and/or desoldering of a land grid array (LGA) component and a corresponding circuit grid present on the surface of a printed circuit board (PCB). The nozzle device comprises a vacuum for supporting the LGA parallel to the PCB, with array contact, a fixed orifice gap for directing hot gas horizontally through the array, and a gas outlet. Uniform circulation of the hot gas is continued to produce uniform, simultaneous melting of the solder array to permit bonding to or desoldering from the circuit array of the PCB while supporting the component parallel to the PCB.

14 Claims, 3 Drawing Sheets

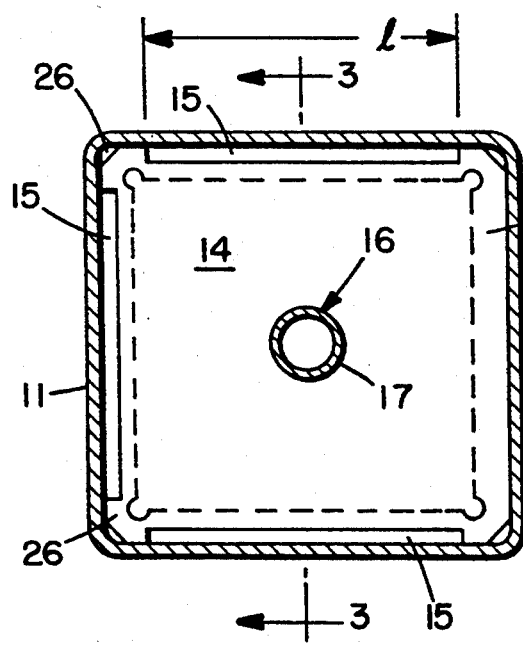
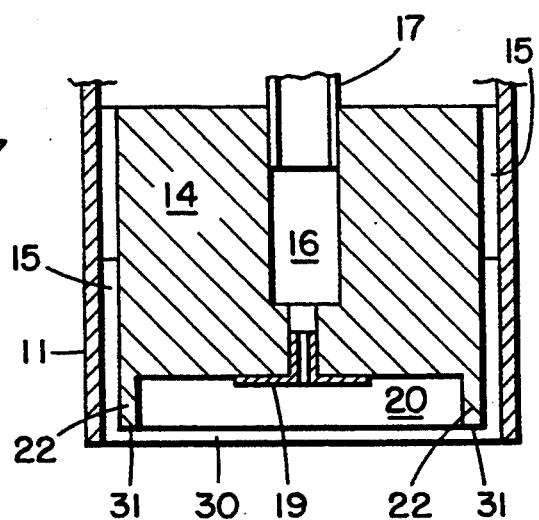
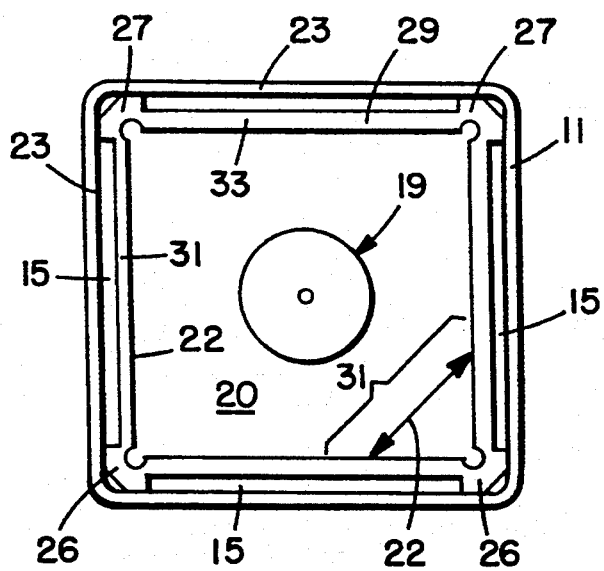

PROCESS AND APPARATUS FOR ATTACHING/DEATACHING LAND GRID ARRAY COMPONENTS

BACKGROUND OF THE INVENTION

1. Field of the Invention

The present invention relates to an improved process and apparatus, including improved gas nozzle devices, for the soldering and desoldering of electrical circuit components to a printed circuit board. More specifically, the present invention relates to improvements or modifications in gas nozzle devices to render them useful for the attachment or detachment of electrical circuit components having a land grid array of solder connections to a companion array of circuit connections printed onto the surface of the printed circuit board.

2. State of the Art

A variety of soldering/desoldering machines are known for the attachment and deattachment of electrical circuit components from areas of crowded printed circuit boards, adjacent to other closely-spaced soldered components which are not to be disturbed. Reference is made to commonly-assigned U.S. Pat. No. 5,044,072 for its disclosure of such an apparatus, including vacuum gas nozzles for holding an electrical component relative to a PCB surface and for directing hot gas through slots therein downwardly against peripheral component leads and corresponding peripheral solder pads on the PCB. The hot gas melts the solder to permit the attachment or deattachment, as desired, of the component relative to tile PCB surface.

While such known processes and nozzles produce excellent results with conventional peripheral-lead components, they are not satisfactory for use with face-down or land grid array (LGA) components, including ball grid array (BGA) components, solder grid array (SGA) components, and column grid array (CGA) components. Such components comprise a grid array of spaced solder connections distributed over the undersurface thereof, for electrical connection to a companion array of spaced circuit connections exposed at the upper surface of the printed circuit board. Conventional soldering/desoldering machines and conventional vacuum/gas nozzles are unreliable and ineffective for the soldering or desoldering of LGA components. Therefore such components must be soldered in an oven environment during production soldering of the entire PCB assembly. Reworking or individual component selective/desoldering of these hidden lead LGA components is substantially impossible since it requires the provision of a uniform heat pattern through the component to melt all of the solder balls or columns of the array uniformly and substantially simultaneously.

The use of LGA components is growing in view of the advances in technology and the complexity of electrical circuit components which require a greater number of electrical connections which the peripheral area of the component body is not able to accommodate. LGA technology permits a large number of terminal connections to be printed in the form of a grid or array on the undersurface of the component, which connections are hidden beneath the body of the component being attached or detached. The exclusion of peripheral or perimeter leads, extending outwardly from the component, enables components to be mounted in closer proximity to each other, which saves vital PCB surface space or area to enable an increase in component population or a decrease in PCB size.

SUMMARY OF THE INVENTION

According to the present invention, uniform heating of the land grid solder array on the undersurface of a LGA component, at the interface with a PCB, is provided by supporting the LGA component relative to the PCB surface, and directing a continuous hot gas flow through restricted gas orifices in a supporting nozzle device, under the component and through said land grid solder array, and venting it away therefrom, until all of the solder balls or columns of the array become melted in contact with the corresponding companion array of spaced circuit connections on the upper surface of the PCB. If attachment or soldering of the component to the board is being carried out, the gas flow is discontinued to permit the solder array to resolidify to the PCB contact array. If deattachment or desoldering is being carried out, the LGA component is lifted away from the PCB while the solder array is molten. If a new LGA is to be inserted, the PCB melted contact array is cleaned of old solder and new solder connections are prepared for the new LGA component. The new LGA component, containing its land grid solder array, is then supported in registration thereon and heated as discussed above.

It is a critical feature of the present process and apparatus that the solder-melting hot gas is supplied to the underside or multi-contact side of the LGA component from one or more directions, and is withdrawn or permitted to exhaust from one or two opposed directions, whereby a continuous hot gas flow is maintained through all of the spaced solder land islands of the land grid array for a sufficient period of time to produce melting thereof, commonly between about ½ and 2 minutes.

In the case of reworking or desoldering operations, melting releases the solid connections between the LGA component and the board and permits the nozzle device, and the LGA component vacuum-retained therein, to be raised away from the PCB. In the case of securing a new LGA component to the companion land grid contact array on the PCB, melting causes the solder array areas of the component to wet the contact array areas of the PCB and to form a solid bond therewith when the hot gas flow is discontinued.

It will be apparent to those skilled in the art that the flow rate of the hot gas through the spaced solder islands, and the dwell time of the hot gas beneath the LGA component, can be controlled by varying the relative sizes and areas of the gas-inlet orifices and the gas-outlet orifices, and/or by controlling the rate of withdrawal of the hot gas through the gas outlet orifices.

DISCUSSION OF THE DRAWINGS

FIG. 2 is a view along the line 2—2 of FIG. 1;

FIG. 3 is a view along the line 3—3 of FIG. 2, and illustrating the nozzle in the absence of any LGA component in the nozzle cavity;

FIG. 4 is a plan view of the undersurface of the nozzle device of FIG. 3;

DESCRIPTION

In essence, the present invention relates to improvements in the prior-known process, apparatus and hot gas nozzle devices to enable the hot gas melting of solder connections between solder ball or solder column grid arrays present on the face-down or undersurface of land grid array surface components and companion grid array electrical connections present at the surface of a printed circuit board, and comprises the step of providing means for directing the hot gas flow through the interfacial space between said LGA undersurface and said PCB, together with means for venting, discharging or exhausting said gas flow from said space, whereby a continuous flow of the hot gas is maintained between the gas-inlet areas and the gas-outlet areas, distributed through the entire solder array of the LGA component, to produce substantially simultaneous melting of the solder islands without causing the solder islands to flow together and short circuit.

Figure 1:
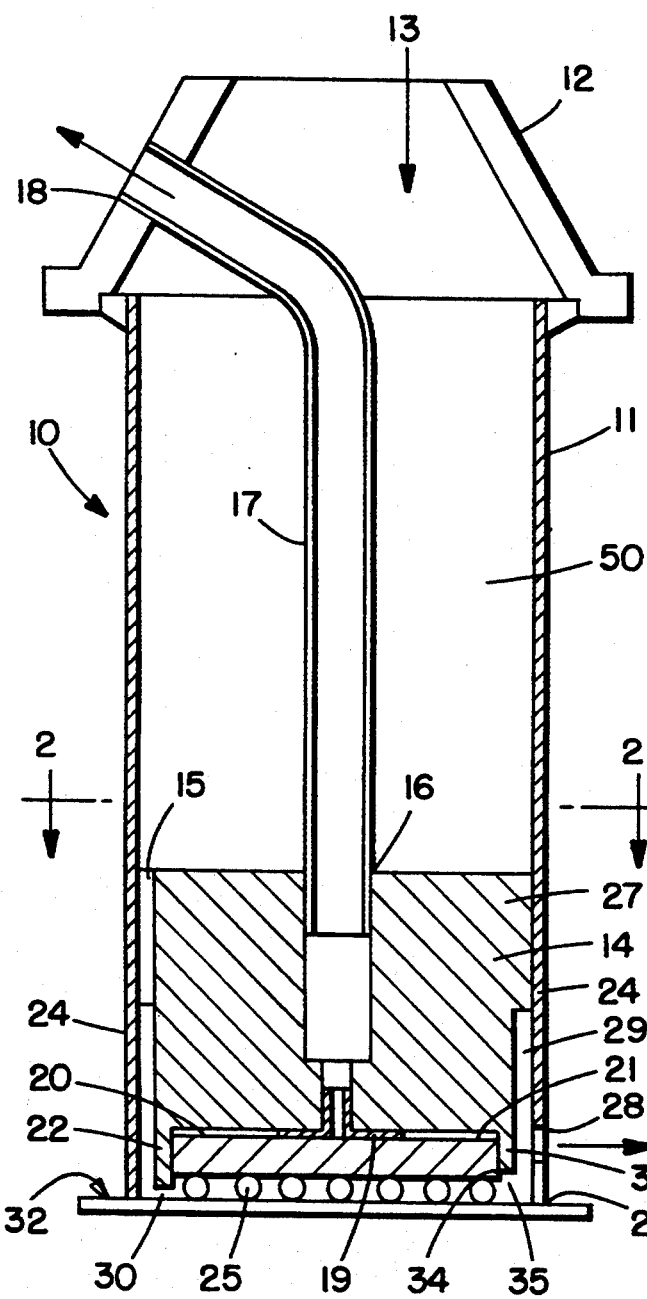
FIG. 1 is a cross-sectional side view of a vacuum/gas nozzle device according to the present invention.

Referring to the drawings, FIG. 1 illustrates a preferred vacuum/gas nozzle device 10 comprising a hollow housing 11 having a rectangular lower wall portion and a cylindrical upper wall portion to which is attached a top cone section 12 which is mountable within the adjustable vacuum/heater head assembly of a surface mount soldering/desoldering apparatus. The cone section 12 comprises a hot gas cone inlet 13 for receiving forced hot gas within the hollow housing 11, and a vacuum inlet 18 to the vacuum tube connection 17 for conveying a vacuum to the vacuum suction cup 19 to retain the component. The nozzle device 10 further comprises a lower block section 14 which seals the lower end of the hollow housing 11 except for three peripheral narrow gas inlet slots 15 and a central vacuum bore 16.

The nozzle device is provided with a rigid vacuum tube connection 17 between a passage 18 through the cone section 12 and the bore 16 in the block 14, to permit a vacuum to be drawn through the nozzle device 10 to a component-engaging vacuum suction cup 19 mounted within a lower restricted outlet of the bore 16, at the central ceiling area of the component-receiving compartment or nesting recess 20 within the underside of the block 14. Recess 20 is substantially square, as illustrated by FIG. 4, and is custom-dimensioned to receive and accommodate a LGA component 21 of predetermined known dimensions so that the sides of the component 21 are closely-spaced from the three inlet walls 22 and the one outlet wall 33 of the recess 20, and so that the depth of the recess 20 from the undersurface of the suction cup 19 to the base 23 of the outer housing wall 24 is substantially the same as the thickness of the LGA component 21 from the upper surface thereof, vacuum-engaged by the suction cup 19, and the undersurfaces of the solder balls 25 of the array.

As illustrated by FIG. 2, the lower block section 14 which seals the lower end of the nozzle housing 11 is connected to the housing 11 at corner connections 26 and at an elongate side connection 27 to the side wall 24 of the housing 11 which contains gas-outlet ports 28 opening into a gas-outlet slot 29 formed between the wall 24 and the block section 14. The hot gas inlet slots 15 are narrow and elongate, having a length "l" as shown in FIG. 2.

Another critical feature of the present nozzle devices 10 according to FIG. 1 is that the width of the elongate hot gas inlet orifices 30 is fixed to equal the difference between the length of the outer housing wall 24, to the base 23 thereof, and the length of the component-nesting inlet recess walls 22, to the base 31 thereof. Thus, the width of the peripheral elongate gas-inlet orifice 30, to which the three gas inlet slots 15 open, is uniform and fixed when the base 23 of the outer wall 24 is seated against the surface of the printed circuit board 32. However the outlet side-wall 33 of the component recess 20 is shorter than the inlet walls 22 and provides a wider elongate outlet orifice 35 between the base 34 thereof and the base 23 of the outer housing wall 24, opening to the outlet slot 29 and outlet orifices 28 at the outlet side of the nozzle device.

Figure 6:
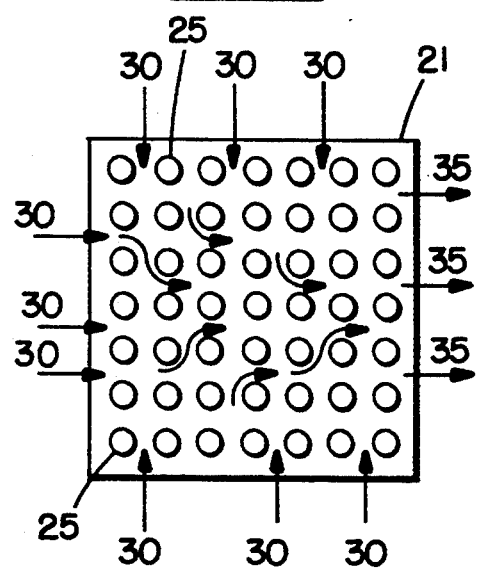
FIG. 6 is an illustration of the gas flow inlet and exhaust paths through a solder ball array, as provided by the nozzle device of FIG. 1.

The supply of hot gas through the cone inlet and through the three gas inlet slots 15 is restricted by the narrow width of the gas inlet orifice 30 and flows at increased velocity from three directions, between and around the individual solder balls 25 of the array on the undersurface of component 21, as illustrated by means of small arrows, and is forced outwardly therefrom through the wider outlet orifice 35 and the outlet ports 28 at the outlet side of the nozzle device, as illustrated by large arrows, in FIG. 6.

As illustrated by FIG. 1, the gas outlet ports 28 in housing wall 24 are spaced upwardly, away from the base 23 thereof, to cause the hot outlet gas to flow upwardly and away from the surface of the PCB and preclude the possible melting or damaging of adjacent components and/or solder connections thereon. Furthermore, a vacuum means may be associated with the outlets 28, or internally with the outlet slot 29 so that the wall outlets 28 are unnecessary, whereby the hot gas inlet flow and outlet flow are controlled and regulated to provide uniform melting and minimum solder-melting time. A vacuum outlet-assist means may be particularly useful in cases where the solder ball array comprises a dense array of small-diameter balls 25 through which it may be difficult for the hot gas to be forced without vacuum-assisted withdrawal.

Figure 7:
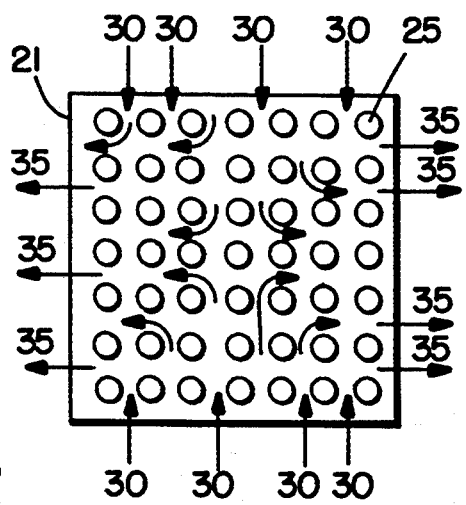
FIG. 7 is an illustration of the gas flow inlet and exhaust paths through a solder ball array as provided by an alternative nozzle device having opposed inlet orifice sides and opposed exhaust orifice sides.
Figure 5:
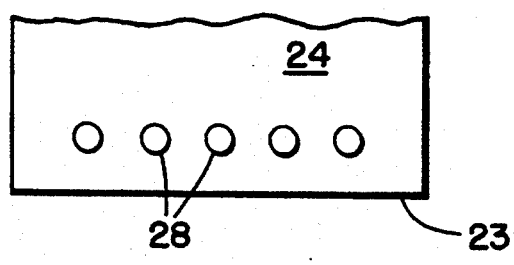
FIG. 5 is a sectional view of the exhaust surface of the nozzle device of FIG. 1.

FIG. 7 illustrates the hot gas inlet and outlet paths provided by a modified nozzle device, similar to that of FIGS. 1-5 but having a block section having a lefthand side which is identical to the righthand side shown in FIG. 1, and also having outlet ports 28 on the left side of the housing wall 24. Hot inlet gas is forced at increased velocity through narrow inlet orifices 30 at opposed sides of the nozzle device through the array of solder balls 25 on the undersurface of the component 21, and is exhausted through the wider outlet orifices 35 to outlet ports 28 at opposed sides of the nozzle device.

Figure 8:
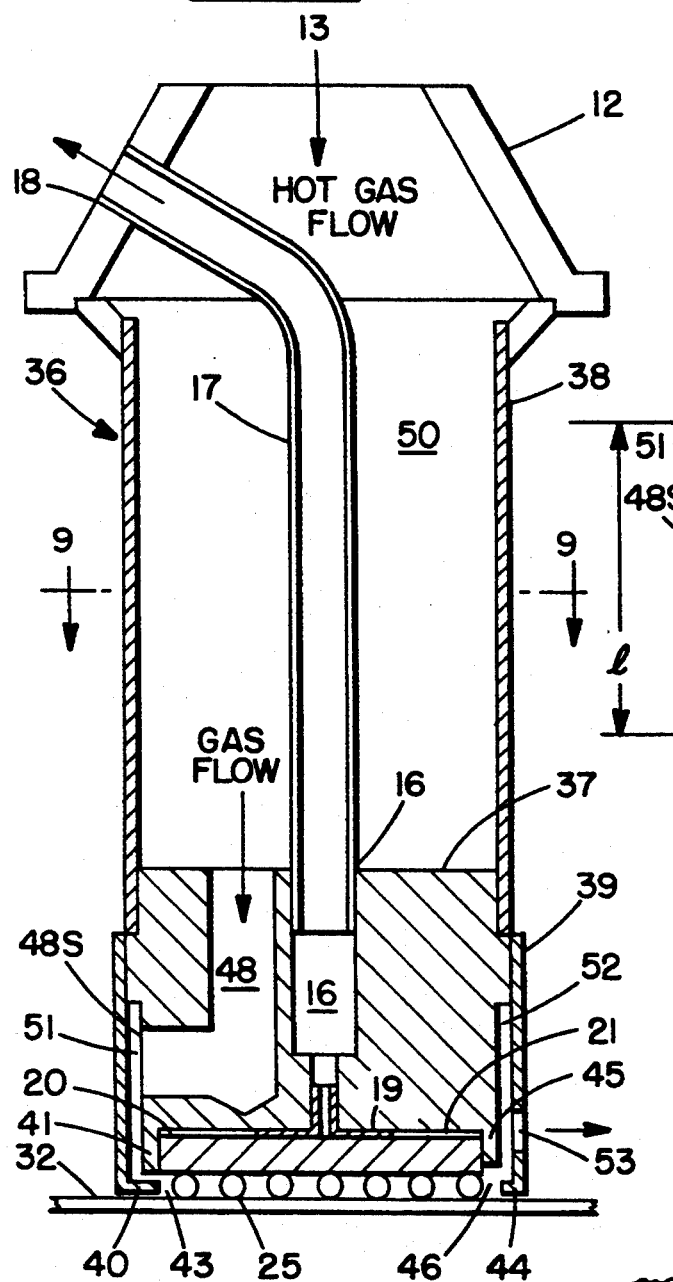
FIG. 8 is a cross-sectional side view of a vacuum/gas nozzle device according to another embodiment of the present invention.
Figure 9:
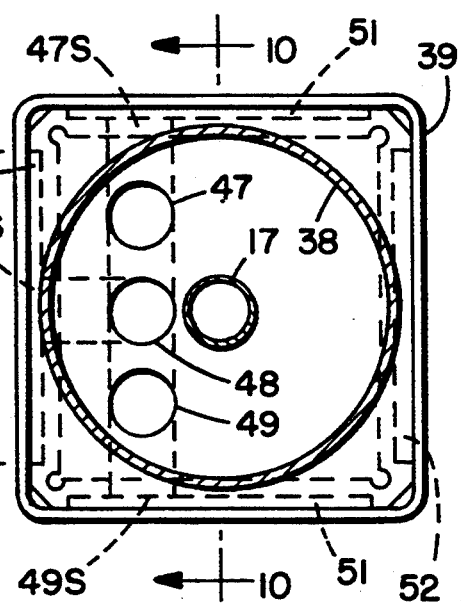
FIG. 9 is a view taken along the line 9—9 of FIG. 8.
Figure 10:
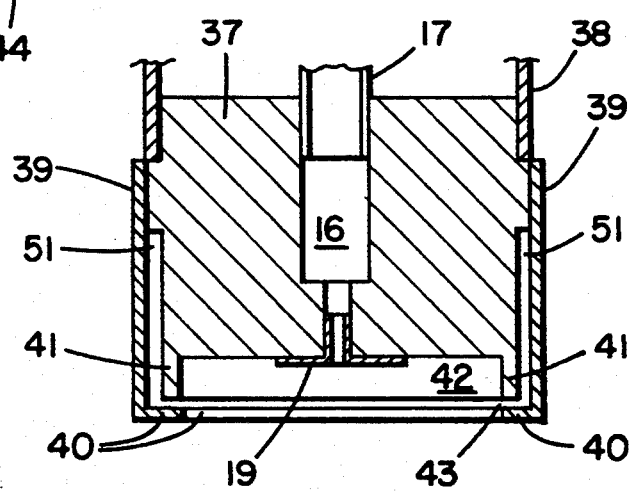
FIG. 10 is a view taken along the line 10—10 of FIG. 9.

FIGS. 8 to 10 illustrate a vacuum/gas nozzle device 36, some elements of which are similar to corresponding elements of the device 10 of FIG. 1 and are numbered the same as therein. The most important differences relate to the lower rectangular block section 37 and to the outer peripheral housing wall which comprises an upper cylindrical chamber wall section 38 and a lower rectangular block section wall 39 having a peripheral flange or lip 40 which extends inwardly to overlap the inlet-side walls 41 defining the component-receiving compartment or nesting recess 42 in fixed closely-spaced relation to define therebetween a narrow gas-inlet orifice 43 which opens beneath the component recess 42 at three inlet sides thereof. A smaller or narrower outlet side flange or lip 44 is spaced by a wider outlet orifice 46 from the shorter outlet-side wall 45 of the nesting recess 42.

The lower block element 37 is provided with three bores 47, 48 and 49 which are open at the top to the chamber 50 of the nozzle device 36, and each of which is also open at a different side 47s, 48s and 49s of the device into hot gas inlet slots 51 which exit through the narrow inlet orifice 43 to the underside of the nesting recess 42.

As with the nozzle device of FIG. 1, a vacuum is drawn through the tube 17 and the suction cup 19 to hold a LGA component 21 within the recess 42, the nozzle device 36 being mounted within the adjustable heater head of a surface mount soldering/desoldering apparatus. The heater head is lowered and adjusted into position over a PCB 32 until the solder ball array on the component 21, held within the nozzle device 36, contacts the aligned circuit array on the PCB 32. Hot gas is introduced to nozzle chamber 50 through cone opening 13 and is forced through bores 47, 48 and 49 to enter at increased velocity through inlet orifice 43 at three sides of the component recess 42, and to exit or be withdrawn through orifice 46 into gas outlet slot 52, formed at the outlet side of the block section 37, and through outlet ports 53 in the wall section 39, similar to outlet ports 28 illustrated by FIG. 5. The gas flow path is similar to that illustrated by FIG. 6.

The advantages of the lower flanged nozzle device 36 of FIG. 8 are that the inlet flange or lip 40 provides a fixed gap inlet orifice 43, independent of any possible warpage of the PCB, and the flange or lip 40 forms a horizontally-directed inlet orifice 43 which injects the hot gas horizontally under the component 21 and through the solder ball or solder column array. This is true even if the lower wall 39 is elongated so that the flange or lip 40 engages the surface of the PCB, provided that the walls 41 of the component recess 42 are also elongated, or the lip 40 is increased in thickness, so that the width of the inlet gap 43 is fixed at the desired size.

As stated hereinbefore, the present nozzles 10 of FIG. 1 and 36 of FIG. 8 are precision dimensioned to support an LGA component 21 in alignment over the surface of the PCB 32 so that the undersurfaces of the solder balls 25 lightly engage the contact areas of the PCB. This prevents crushing and spreading of the solder balls during the melting step. With the nozzle 10 of FIG. 1, in which the lower section of the housing wall 24 forms a skirt, the base 23 of which engages the surface of the PCB 32, the component 21 is automatically supported in the desired position provided that the depth of the recess 20 is properly machined so that the distance between the undersurface of the vacuum cup 19 and the surface of the PCB 32 corresponds to the thickness of the component 21 from the upper surface thereof to the undersurfaces of the solder balls 25.

With the nozzle 36 of FIG. 8, in which the under surface of the peripheral lip or flange 44 of the lower wall section 39, as illustrated, does not contact the surface of the PCB 32, it is advantageous to provide some means for determining the proper support position of the nozzle 36 above the PCB surface 32, to prevent crushing and spreading of the solder/balls 25 during melting.

In certain soldering/desoldering machines, such as that of aforementioned U.S. Pat. No. 5,044,072, the vertical positioning means may be calibrated so that the proper stop positions for different nozzles 36 may be predetermined and recorded.

Also, the lip or flange 44 may be provided with one or more spaced pin extensions or feelers which contact the surface of the PCB 32 at the desired location to support the component 21 with the undersurfaces of solder balls 25 in light contact with the PCB surface.

It will be apparent to those skilled in the art that a number of different operational parameters of the present nozzle devices can be varied in relative relationship to each other in order to vary the results produced. Thus, the relative widths and overall lengths of the gas-inlet orifice and gas-outlet orifice are important and can be altered, relative to each other, to provide nozzle devices having different flow rates through the solder ball array. The length "l" of the inlet slots and of the outlet slots can be varied, and the slots may be located on adjacent or opposed sides of the device to produce the desired uniformity of solder melting. Also, the pressure and/or temperature of the hot gas can be adjusted to provide the desired uniform and simultaneous melting of the solder balls or columns.

The vacuum retention of the LGA components within the recess of the present nozzle devices, parallel to the PCB, supports the solder array in surface contact with the circuit array on the PCB, and the suction cup permits some flexible movement of the component if solder coplanarity is not perfect. Also the retention of the component prevents any tilting or sagging of the component when melting of the solder array occurs.

Each of the present unitary nozzle devices is precision manufactured to accommodate a particular LGA component. Thus the dimensions of the component-receiving recess are such as to firmly retain the LGA component therein and to cause the undersurface of the solder ball array of a retained component to engage the PCB surface without crushing of the solder balls.

The use of the present nozzle devices in association with a hot gas soldering/desoldering apparatus of the type disclosed in aforementioned U.S. Pat. No. 5,044,072 reduces any risk of misalignment of the LGA/component relative to the circuit array on the PCB, alleviates process problems and simplifies operation procedures for the soldering and/or desoldering of land grid array components including solder bump array components, ball grid array components, column grid array components and other components having partially or completely hidden solder connections such as flip chips and leaded and leadless chip carriers, both ceramic and plastic. Such soldering/desoldering apparatus comprises a releasable clamping means for receiving and engaging the top cone section of each nozzle device within the adjustable vacuum/hot gas heater head assembly, for supplying vacuum through the nozzle device to retain the component, and for supplying hot gas through the aligned nozzle device for the soldering or desoldering operation.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A unitary vacuum/hot gas nozzle device for supporting an electrical component having a meltable solder lead array on the undersurface thereof in contact with a corresponding circuit array present on the surface of a printed circuit board, and for directing a continuous flow of hot gas under said supported electrical component to circulate through said solder lead array and melt said solder leads uniformly and substantially simultaneously, said nozzle device comprising a housing having an upper wall section enclosing an internal hot gas chamber and a lower wall section having a base and enclosing a block member having a central component-supporting recess in the undersurface thereof, a vacuum tube connection, through said housing and block member to said recess, to retain said component within said recess, gas inlet means for receiving hot gas into said hot gas chamber, gas inlet slots for channeling the hot gas from said chamber to at least a portion of the outer periphery of said recess, a narrow hot gas orifice for directing said channeled hot gas horizontally in at least one direction under said component and through the meltable solder lead array on the undersurface of said component retained by said vacuum means within said recess, and a hot gas outlet for venting, in at least one opposed direction, hot gas which has passed through said solder lead array, to maintain a continuous flow of hot gas through the meltable solder lead array and produce uniform and substantially simultaneous melting thereof while the component is retained in said recess with the solder lead array in contact with or bonded to a corresponding circuit array present on the surface of said printed circuit board.

2. A nozzle device according to claim 1 in which said housing has a top cone section having an inlet opening to said vacuum tube connection, and another inlet opening comprising said gas inlet means for receiving hot gas into said hot gas chamber.

3. A nozzle device according to claim 1 in which said vacuum tube connection terminates in a vacuum suction cup within said component-supporting recess, for vacuum-engagement with said component.

4. A nozzle device according to claim 1 in which at least portions of the lower wall section of the housing are of sufficient length that the base contacts the upper surface of a printed circuit board, and the depth of the component-supporting recess is predetermined for each supported component so that the undersurface of the solder array thereof engages the surface of the printed circuit board when said base of the lower wall section is in contact with the surface of the printed circuit board.

5. A nozzle device according to claim 1 in which the base of the lower wall section of the housing comprises an inwardly - extending flange or lip which is spaced from the undersurface of the block member to form said narrow hot gas orifice.

6. A nozzle device according to claim 1 in which said hot gas outlet comprises one or more openings in the lower wall section of the housing, spaced upwardly, away from the base of said wall section, for venting hot gas away from the surface of a printed circuit board.

7. Process for the uniform, substantially-simultaneous melting of the leads of a solder lead array present on the undersurface of a component while said array is in contact with or bonded to a corresponding circuit array present on the upper surface of a printed circuit board, comprising supporting said component within a recess by means of a vacuum to maintain Said component parallel to the printed circuit board surface with said solder lead array and said circuit array aligned in contact; directing a continuous flow of hot gas through a narrow orifice, under said component and horizontally through said solder lead array in at least one direction, and exhausting said hot gas from said array in at least one opposed direction, and controlling said continuous hot gas flow through said solder lead array to produce the uniform and simultaneous melting of said solder lead array and permit bonding to or separation from the circuit array on said printed circuit board while said component is supported parallel to the surface of the printed circuit board.

8. Process according to claim 7 which comprises regulating the pressure, temperature and/or the rate of introduction of the hot gas to control the continuous gas flow and the duration required for said uniform and simultaneous melting.

9. Process according to claim 7 which comprises supporting said component by means of vacuum within a recess having surrounding walls which define, between the undersurfaces thereof and the upper surface of said printed circuit board, said narrow gas orifice, said recess being present at the undersurface of a block member.

10. Process according to claim 9 in which said block member is present within a housing having outer peripheral walls Which engage the surface of the printed circuit board to retain the supported component uniformly spaced from the surface of the printed circuit board during melting of the solder lead array, thereby preventing crushing thereof.

11. Process according to claim 9 in which said block member is present within a housing having outer peripheral walls having an inwardly-directed flange at the base of at least a portion of said peripheral walls to form said narrow gas orifice between said flange and the undersurfaces of said surrounding walls of said recess.

12. A unitary vacuum/hot gas nozzle device for supporting an electrical component having a meltable solder lead array on the undersurface thereof in contact with a corresponding circuit array present on the surface of a printed circuit board, and for directing a continuous flow of hot gas under said supported electrical component to circulate through said solder lead array and melt said solder leads uniformly and substantially simultaneously, said nozzle device comprising a housing having an upper wall section enclosing an internal hot gas chamber and a lower peripheral wall section having a base and enclosing a block member having a central component-supporting recess in the undersurface thereof, defined by a depending surrounding wall enclosing said recess, a vacuum tube connection, through said housing and block member to said recess, to retain said component within said recess, gas inlet means for receiving hot gas into said hot gas chamber, gas inlet slots for channeling the hot gas from said chamber to at least a portion of the outer periphery of said recess, a narrow hot gas orifice defined between the undersurface of said depending wall enclosing said recess and the upper surface of said printed circuit board for directing said channeled hot gas horizontally in at least one direction under said electrical component and through the meltable solder lead array on the undersurface of said component retained by vacuum means within said recess, and a hot gas outlet for venting, in at least one opposed direction, hot gas which has passed through said solder lead array, to maintain a continuous flow of hot gas through the meltable solder lead array and produce uniform and substantially simultaneous melting thereof while the component is retained in said recess with the solder lead array in contact with or bonded to a corresponding circuit array present on the surface of said printed circuit board.

13. Process for the uniform, substantially-simultaneous melting of the leads of a solder lead array present on the undersurface of a component while said array is in contact with or bonded to a corresponding circuit array present on the upper surface of a printed circuit board, comprising the steps of providing a housing having an outer peripheral wall and a central component-supporting recess which is surrounded by a depending wall which is separated from said outer peripheral wall by a space; drawing a vacuum in said recess and introducing thereto a said component to retain said component parallel to the upper surface of a printed circuit board with the solder lead array and the circuit board array aligned in contact; directing a continuous flow of hot gas through the space between the outer peripheral wall of the housing and the depending wall of said recess, and through a narrow gas orifice defined by the undersurface of said depending wall and the upper surface of said printed circuit board, beneath said component and horizontally through said solder lead array in at least one direction, and controlling said continuous hot gas flow through said solder lead array to produce the uniform and simultaneous melting of said solder lead array and permit bonding to or separation from the circuit array on said printed circuit board while said component is supported parallel to the surface of the printed circuit board.

14. Process according to claim 13 which comprises making the outer peripheral wall of the housing sufficiently long to support the enclosure upon the surface of the printed circuit board and support the undersurface of the depending wall of the recess closely-spaced from the upper surface of the printed circuit board to define therebetween said narrow gas orifice.

* * * * *